United States Patent
Yoshida et al.

(10) Patent No.: US 8,268,705 B2
(45) Date of Patent: Sep. 18, 2012

(54) METHOD FOR PRODUCING SOI WAFER

(75) Inventors: Kazuhiko Yoshida, Nagano (JP); Masao Matsumine, Nagano (JP); Hiroshi Takeno, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 138 days.

(21) Appl. No.: 12/226,264

(22) PCT Filed: Apr. 23, 2007

(86) PCT No.: PCT/JP2007/058735
§ 371 (c)(1),
(2), (4) Date: Oct. 14, 2008

(87) PCT Pub. No.: WO2007/125863
PCT Pub. Date: Nov. 8, 2007

(65) Prior Publication Data
US 2009/0280620 A1 Nov. 12, 2009

(30) Foreign Application Priority Data
Apr. 24, 2006 (JP) .................................. 2006-118987

(51) Int. Cl.
*H01L 21/322* (2006.01)
(52) U.S. Cl. ................................. 438/473; 257/E21.318
(58) Field of Classification Search .................. 438/455, 438/458, 473; 257/E21.318
See application file for complete search history.

(56) References Cited

U.S. PATENT DOCUMENTS

| 3,769,109 | A  | * | 10/1973 | MacRae et al. | ............... | 438/701 |
| 5,554,883 | A  | * | 9/1996  | Kuroi         | ............... | 257/617 |
| 5,953,622 | A  | * | 9/1999  | Lee et al.    | ............... | 438/458 |
| 6,635,950 | B1 | * | 10/2003 | Ishida et al. | ............... | 257/607 |
| 2002/0022346 | A1 | * | 2/2002 | Gonzalez et al. | ........... | 438/473 |
| 2002/0187619 | A1 | * | 12/2002 | Kleinhenz et al. | .......... | 438/471 |
| 2004/0004271 | A1 |   | 1/2004 | Fukuda et al. |   |   |
| 2004/0075143 | A1 |   | 4/2004 | Bae et al.    |   |   |
| 2004/0166650 | A1 |   | 8/2004 | Yokokawa et al. |   |   |
| 2004/0180512 | A1 | * | 9/2004 | Linn et al.   | ................. | 438/458 |
| 2005/0014346 | A1 |   | 1/2005 | Mitani et al. |   |   |

(Continued)

FOREIGN PATENT DOCUMENTS

CN 1748312 A 3/2006

(Continued)

OTHER PUBLICATIONS

Office Action issued in Chinese Patent Application No. 2007800144720 on Sep. 25, 2009 with partial translation.

(Continued)

*Primary Examiner* — William D Coleman
*Assistant Examiner* — Christine Enad
(74) *Attorney, Agent, or Firm* — Oliff & Berridge, PLC

(57) ABSTRACT

The present invention is a method for producing an SOI wafer comprising at least a step of forming an ion-implanted damaged layer by ion-implanting a neutral element electrically inactive in silicon from one surface of the base wafer or the bond wafer, in which ion-implanting in the step of forming the ion-implanted damaged layer is performed at a dosage of $1 \times 10^{12}$ atoms/cm$^2$ or more and less than $1 \times 10^{15}$ atoms/cm$^2$. As a result, there may be provided a method for producing an SOI wafer having sufficient gettering ability while the suppression of leak failure, degradation of oxide dielectric breakdown voltage or the like is provided.

8 Claims, 6 Drawing Sheets

U.S. PATENT DOCUMENTS

2006/0051945 A1    3/2006   Yokokawa et al.
2006/0063353 A1*   3/2006   Akatsu .................... 438/455

FOREIGN PATENT DOCUMENTS

| JP | A-06-163862 | 6/1994 |
| JP | A-08-078644 | 3/1996 |
| JP | A-10-032209 | 2/1998 |
| JP | B2-3048201  | 3/2000 |

OTHER PUBLICATIONS

Jun. 24, 2011 extended European Search Report issued in EP 07 74 2170.9.

Office Action issued in Japanese Patent Application No. 2007-112044; mailed May 15, 2012.

* cited by examiner

[Fig. 1]
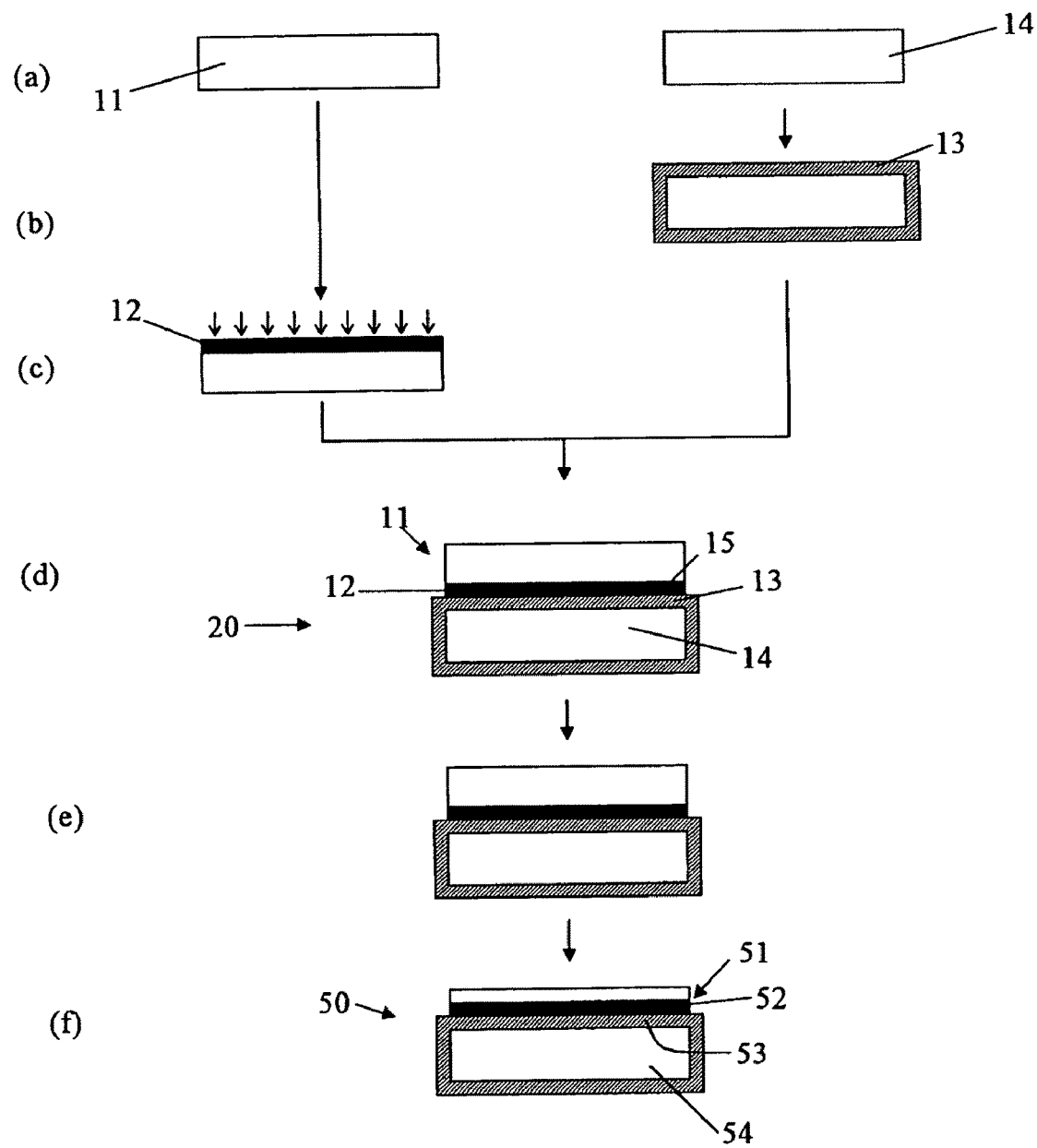

[Figs. 2]
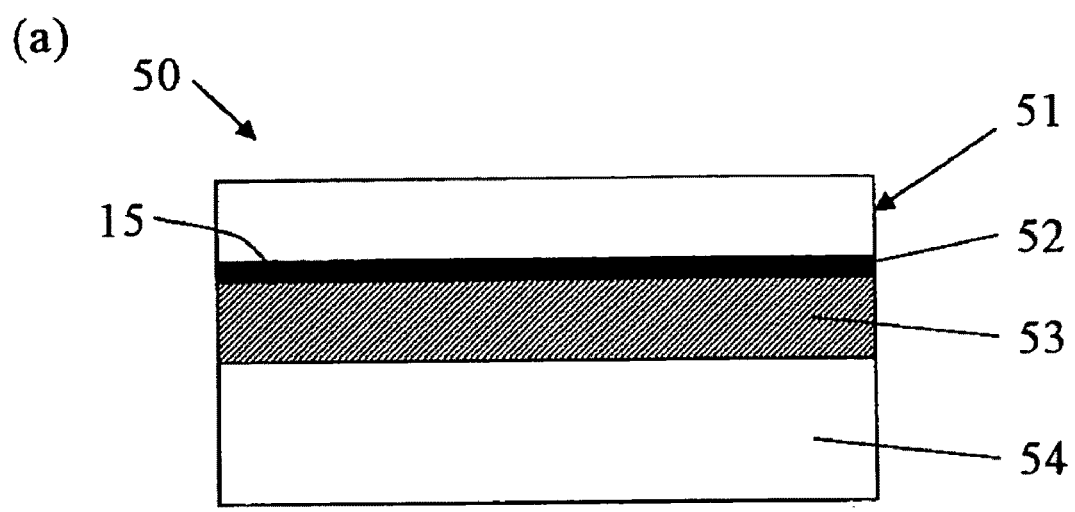
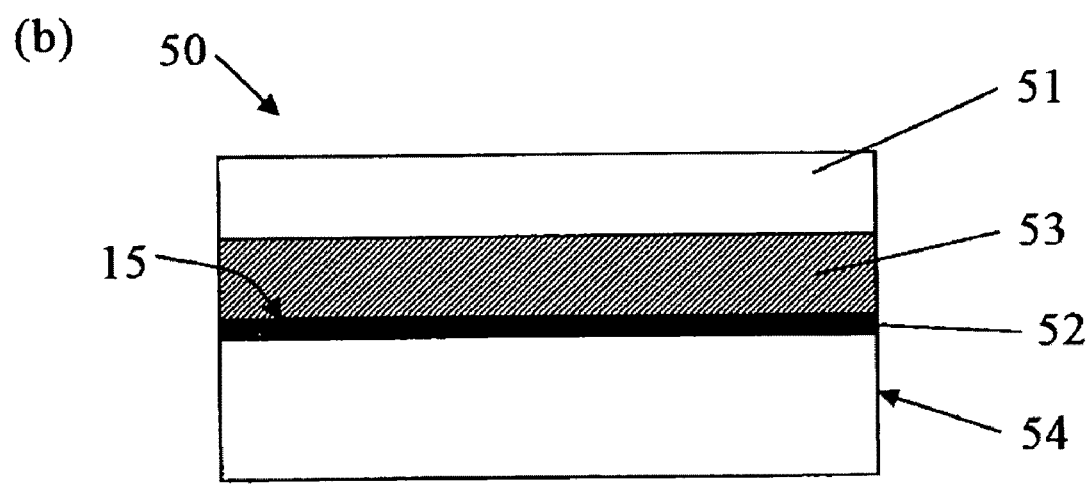

[Fig. 3]
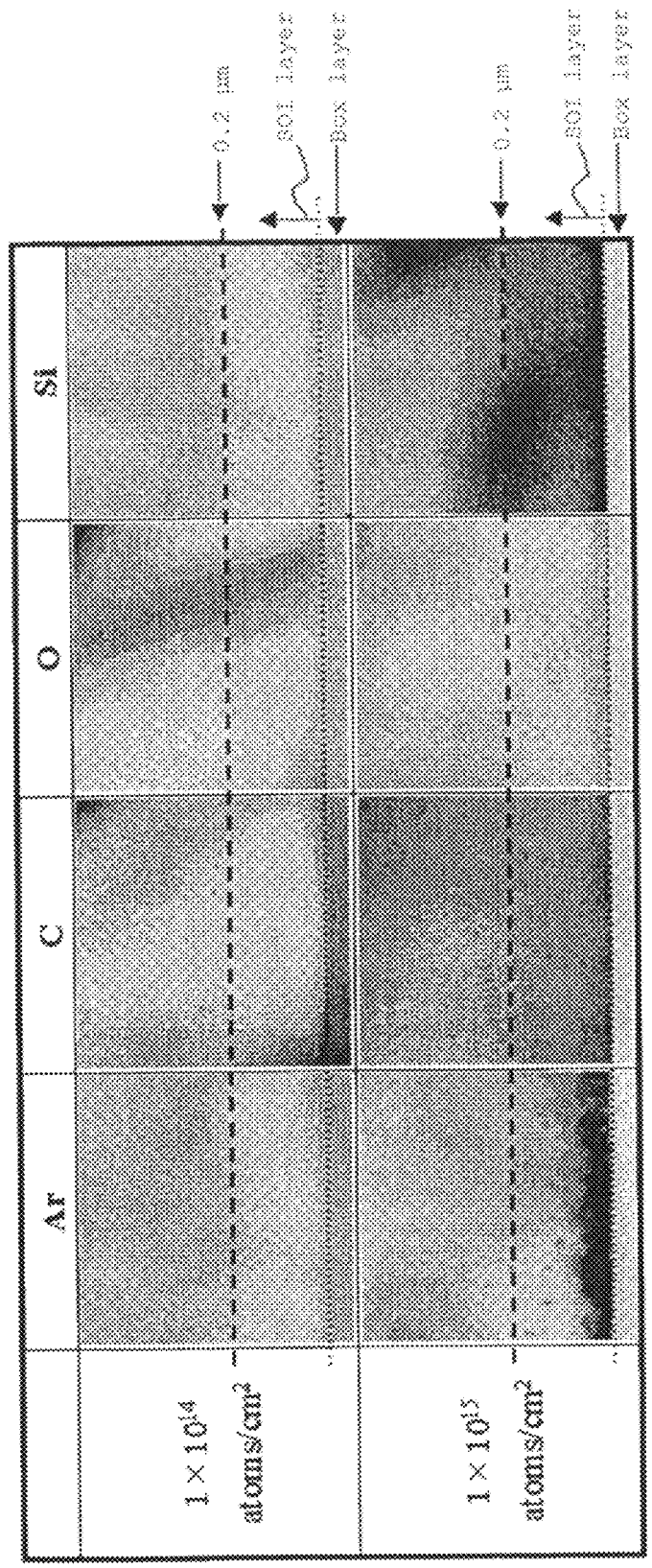

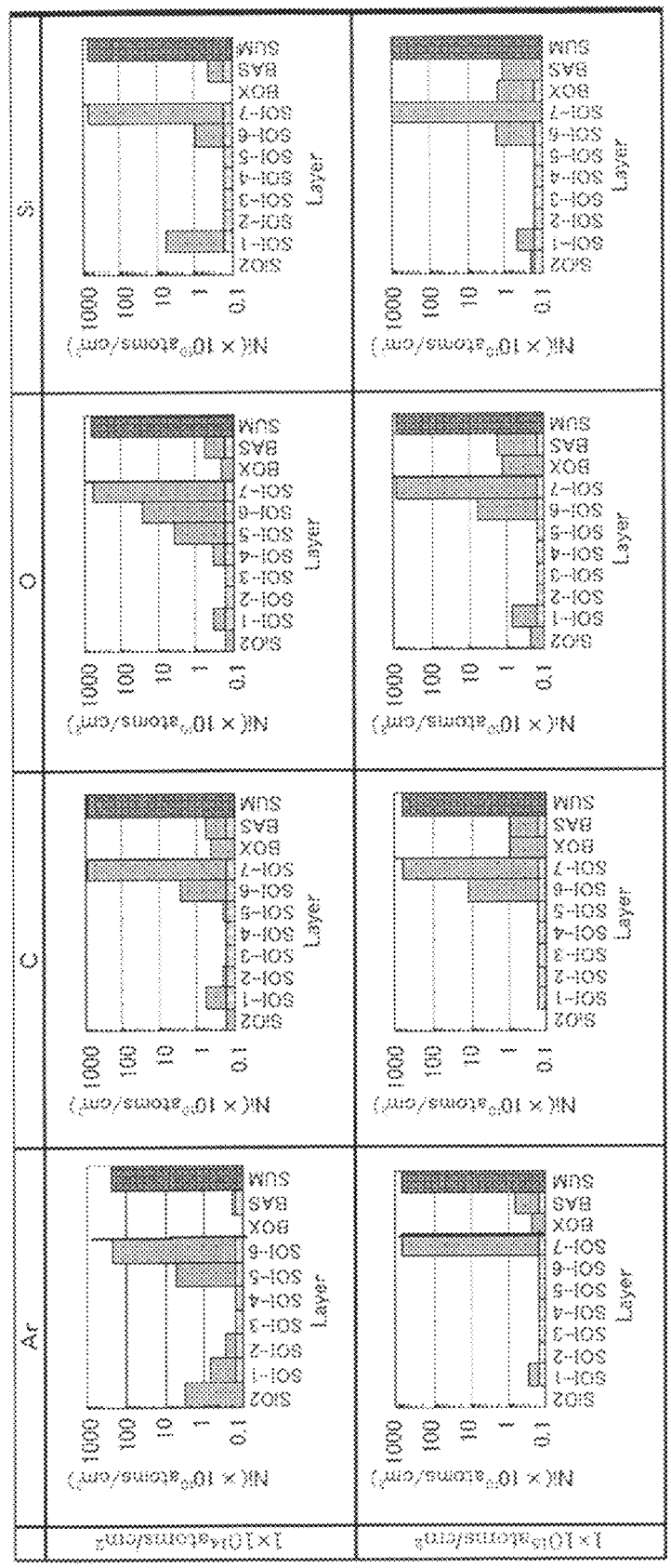
[Fig. 4]

[Fig. 5]
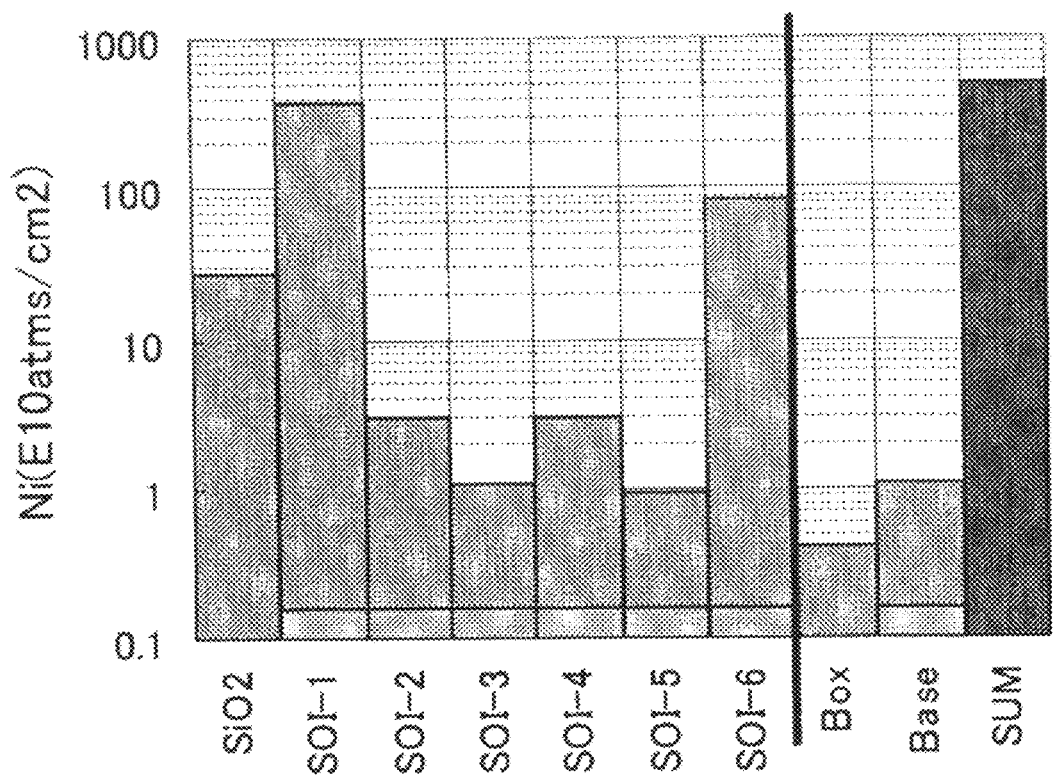
[Fig. 6]
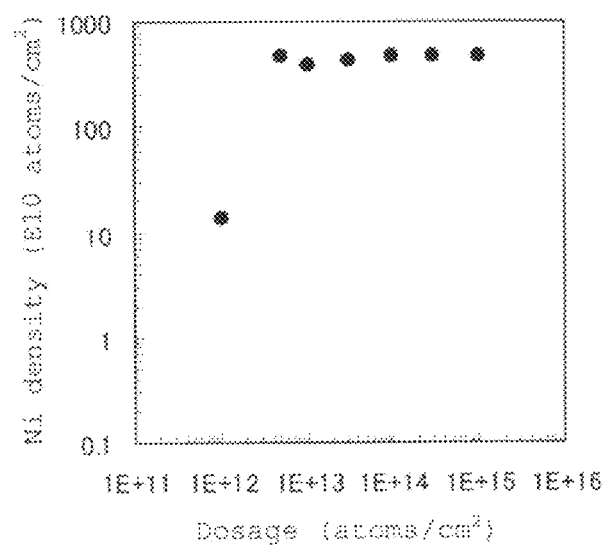

[Fig. 7]
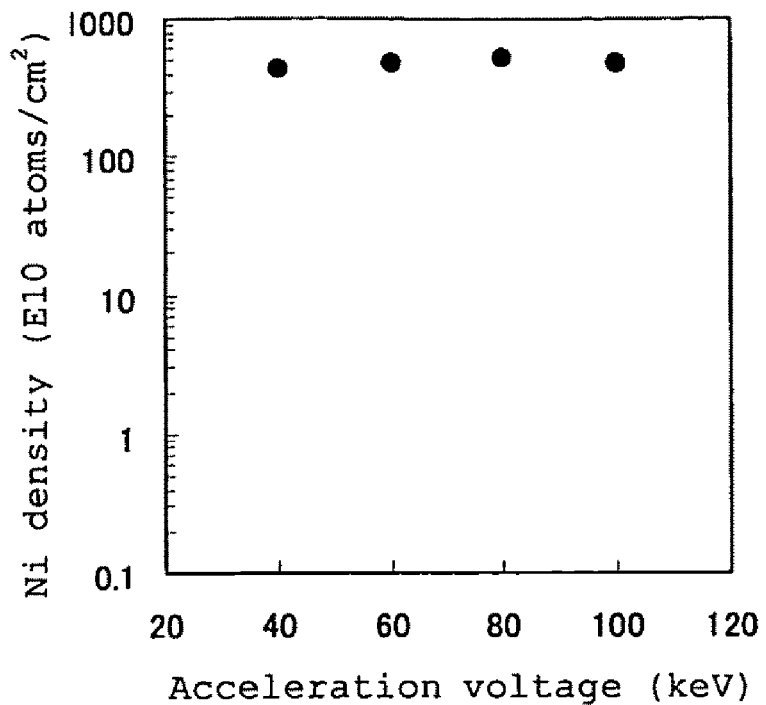
[Fig. 8]
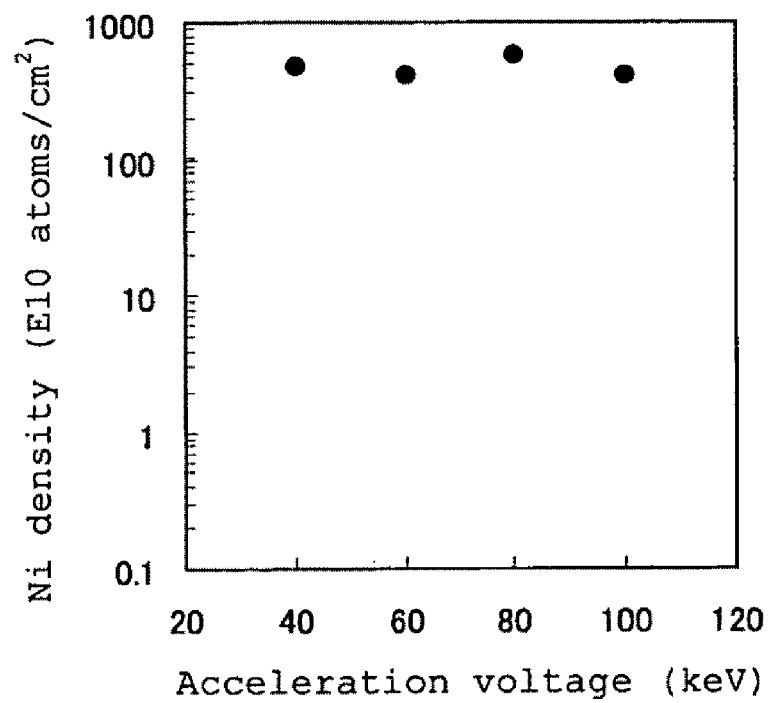

METHOD FOR PRODUCING SOI WAFER

TECHNICAL FIELD

The present invention relates to a method for producing an SOI (Silicon on Insulator) wafer by a bonding method and particularly to a method for producing an SOI wafer having gettering ability.

BACKGROUND ART

SOI wafers have recently been used to produce highly integrated CMOSs, ICs, high breakdown voltage devices and the like. A concrete structure of an SOI wafer is a three-layer structure in the depth direction of the wafer as follows: a silicon single crystal layer (hereinafter referred to as an SOI layer) that is a surface layer and is used as an active layer providing an area for fabricating a device; a buried insulator layer (hereinafter sometimes referred to as a Box layer) such as an oxide film put under the silicon single crystal layer; and another silicon single crystal layer (hereinafter referred to as a support substrate) is placed under the buried insulator layer. The SOI wafer with such a structure has characteristics such as a low parasitic capacitance and a high radiation resistance. Therefore effects such as high-speed, low power-consumption performance, latch up suppression are expected and the SOI wafer is promising as a substrate for a high-performance semiconductor device.

As a method for producing the SOI wafer, for example, the following methods are known. Namely, two mirror-polished silicon single crystal wafers (a silicon single crystal wafer to serve as an SOI layer (a bond wafer) and a silicon single crystal wafer to serve as a support substrate (a base wafer)) are prepared and an oxide film is formed on a surface of at least one of the silicon single crystal wafers. Next, after the silicon single crystal wafers are bonded via the oxide film, a bonding heat treatment is conducted in order to increase bonding strength. Then, the bond wafer is thinned to obtain an SOI wafer having an SOI layer formed. Examples of methods for thinning are as follows: a method where grinding, polishing, or the like are performed on the bond wafer until a desired thickness is obtained; and a method, which is called an ion implantation delamination method (for example, Japanese Patent No. 3048201), where a delamination layer is formed by ion-implanting hydrogen or helium in advance before bonding, thinning is conducted by a delamination heat treatment at a temperature lower than the temperature of the bonding heat treatment and a delamination of the bond wafer at the delamination layer, and then the above-mentioned bonding heat treatment is conducted.

Although the SOI wafer has a lot of structural advantages in view of electrical characteristics as described above, the SOI wafer has structural disadvantages in view of resistance to contamination with metal impurities. This is because diffusion rates of metal impurities are generally slower in silicon oxide than in silicon. As a consequence, in the case of a contamination from an SOI layer surface, the metal impurities accumulate in the thin SOI layer due to the difficulty for the metal impurities to pass the Box layer. Thus a harmful effect of metal contamination is increased as compared with a silicon substrate having no SOI structures. Therefore it is one of the more important qualities in the case of an SOI wafer to have the ability of capturing metal impurities and removing the metal impurities from the area to serve as an active layer for a semiconductor device (gettering ability).

In each gettering method generally used for a silicon substrate having no SOI structures (oxide precipitation, high-density boron addition, a back surface polycrystalline silicon film, and the like), a gettering layer is introduced on the support substrate opposite to the active layer. However, even if a gettering layer is introduced on the support substrate using similar techniques, the above-mentioned gettering layer does not function fully due to the difficulty for the metal impurities to pass the Box layer, thus there is a problem in that these techniques are not to be applied to an SOI wafer as they are.

In order to solve such a problem, in methods for producing an SOI wafer by a bonding method, there have conventionally been proposed methods where a gettering area is introduced in the neighborhood of the SOI layer.

For example, there is a method where phosphorus or silicon is ion-implanted into a surface to be bonded of the bond wafer before bonding to cause strains or defects so that the surface serves as a gettering layer between the SOI layer and the Box layer after bonding (see, e.g., Japanese Patent Application Laid-Open Publication No. H6-163862).

In addition, there is also proposed a method where an ion aside from phosphorus and silicon represented by boron, carbon, argon, krypton, and xenon is ion-implanted into a surface to be bonded of the bond wafer before bonding (see, e.g., Japanese Patent Application Laid-Open Publication No. H10-32209).

However, when devices are fabricated using SOI wafers produced by such methods, there is a problem in that abnormal occurrence of leak current or degradation of oxide dielectric breakdown voltage is sometimes observed.

DISCLOSURE OF THE INVENTION

The present invention was accomplished in view of the aforementioned problems and an object of the present invention is to provide a method for producing an SOI wafer having sufficient gettering ability in spite of the abnormal occurrence of leak current, degradation of oxide dielectric breakdown voltage, or the like being suppressed.

The present invention was accomplished in order to solve the aforementioned problems and provides a method for producing an SOI wafer having at least the steps of: preparing a base wafer and a bond wafer made of silicon single crystal; forming an insulator film on a surface of at least one of the base wafer and the bond wafer; forming an ion-implanted damaged layer by ion-implanting a neutral element electrically inactive in silicon from a surface of either the base wafer or the bond wafer; bonding, at the ion-implanted surface, the base wafer and the bond wafer via the insulator film; and thinning the bond wafer bonded, in which ion-implanting of the neutral element in the step of forming the ion-implanted damaged layer is performed at a dosage of $1 \times 10^{12}$ atoms/cm$^2$ or more and less than $1 \times 10^{15}$ atoms/cm$^2$.

By performing ion-implanting of the neutral element in a method for producing an SOI wafer having the step of forming the ion-implanted damaged layer by ion-implanting a neutral element electrically inactive in silicon into a base wafer or a bond wafer at a dosage of $1 \times 10^{12}$ atoms/cm$^2$ or more and less than $1 \times 10^{15}$ atoms/cm$^2$ as described above, an SOI wafer having sufficient gettering ability can be produced while there can be suppressed the occurrence of secondary defects from the ion-implanted damaged layer during the bonding heat treatment. As a result, there can be suppressed the abnormal occurrence of leak current, degradation of oxide dielectric breakdown voltage of the SOI wafer.

In this case, the neutral element ion-implanted is preferably at least one of argon, carbon, oxygen and silicon.

By selecting, as the neutral element ion-implanted, at least one of argon, carbon, oxygen and silicon in this way, sufficient gettering ability is efficiently added even at a lower dosage. In addition, at such a low dosage, the occurrence of secondary defects during the bonding heat treatment is more strongly suppressed. Furthermore, these elements are preferable because they rarely have harmful effects on the characteristics of a device.

In this case, the dosage is preferably $1\times10^{13}$ atoms/cm$^2$ or less in the case of ion-implanting carbon, less than $1\times10^{15}$ atoms/cm$^2$ in the case of ion-implanting oxygen, and $1\times10^{14}$ atoms/cm$^2$ or less in the case of ion-implanting argon or silicon.

At such a dosage depending upon the neutral element ion-implanted, there can be suppressed the occurrence of secondary defects during the bonding heat treatment more certainly. Furthermore, even at such a dosage, sufficient gettering ability is added.

In addition, the acceleration voltage during the ion-implantation of the neutral element is preferably 200 keV or less. Moreover, the thickness of the ion-implanted damaged layer is preferably 0.5 μm or less.

When the acceleration voltage during the ion-implantation of the neutral element is 200 kev or less or when the thickness of the ion-implanted damaged layer is 0.5 μm or less, the ion-implanted damaged layer is thin enough to suppress the occurrence of secondary defects from the ion-implanted damaged layer during the bonding heat treatment more strongly. Even at such a thickness of the ion-implanted damaged layer, sufficient gettering ability is added.

In addition, the insulator film is preferably a silicon oxide film, a silicon nitride film, or a combination of these.

When the insulator film is a silicon oxide film, a silicon nitride film, or a combination of these, a compact, high-quality insulator film is easily formed and the SOI wafer is excellent in both an insulating property and gettering ability.

Furthermore, thinning of the bond wafer may be performed by grinding the bond wafer. Thinning of the bond wafer may also be performed by preparing an ion-implanted layer for delaminating before the step of bonding in advance through ion-implanting hydrogen or helium from the surface of the bond wafer, followed by the delamination of the bond wafer at the ion-implanted layer for delaminating through a delamination heat treatment in the step of thinning the bond wafer.

As described above, when thinning of the bond wafer is performed either by grinding the bond wafer, which is appropriate for forming a thick SOI layer, or by an ion implantation delamination method, which is appropriate for forming a thin SOI layer, sufficient gettering ability can be added to the ion-implanted damaged layer and the occurrence of secondary defects from the ion-implanted damaged layer during the bonding heat treatment can be suppressed.

A step of forming an n$^+$ layer by ion-implanting the element to serve as a donor in silicon from the surface ion-implanted with the neutral element at least before the step of bonding may be introduced. In this case, the element to serve as a donor may be at least any one of phosphorus, arsenic, and antimony.

As described above, when the step of forming an n$^+$ layer by ion-implanting an element serving as a donor in silicon from the surface ion-implanted with the neutral element is introduced at least before the step of bonding and an element to serve as a donor is at least any one of phosphorus, arsenic, and antimony, gettering ability of n$^+$ layer and gettering ability of ion-implanted damaged layer are combined so that a stronger gettering site is obtained. In addition, in this case, there can be suppressed the occurrence of secondary defects from the ion-implanted damaged layer during the bonding heat treatment.

Furthermore, in these cases, the dosage of the neutral element is preferably $5\times10^{12}$ atoms/cm$^2$ or more.

When the dosage of the neutral element is $5\times10^{12}$ atoms/cm$^2$ or more, there can be produced an SOI wafer having sufficient gettering ability more certainly.

According to the present invention, there can be produced an SOI wafer having sufficient gettering ability in the ion-implanted damaged layer while the occurrence of secondary defects from the ion-implanted damaged layer during the bonding heat treatment is suppressed. Thus when a device fabrication is carried out using an SOI wafer produced in this way, there can be suppressed the abnormal occurrence of leak current, degradation of oxide dielectric breakdown voltage, or the like because the device has only a few defects as well as high resistance to heavy metal contamination.

BRIEF DESCRIPTION OF THE DRAWINGS

FIG. 1 shows an outline of a method for producing an SOI wafer by a bonding method of the present invention.

FIG. 2 are cross-sectional views of SOI wafers according to the present invention, (a) corresponding to a case where an ion-implanted damaged layer is formed on a bond wafer and (b) corresponding to a case where an ion-implanted damaged layer is formed on a base wafer.

FIG. 3 shows cross-sectional TEM images around damaged ion-implanted layers of SOI wafers obtained in Examples 1 to 4 and Comparative Examples 1 to 4.

FIG. 4 shows gettering abilities of SOI wafers obtained in Examples 1 to 4 and Comparative Examples 1 to 4.

FIG. 5 shows gettering ability of an SOI wafer obtained in Comparative Example 5.

FIG. 6 shows gettering abilities of SOI wafers obtained in Examples 7 to 11 and 16 and Comparative Example 7.

FIG. 7 shows gettering abilities of SOI wafers obtained in Examples 12 to 15.

FIG. 8 shows gettering abilities of SOI wafers obtained in Examples 17 to 20.

BEST MODES FOR CARRYING OUT THE INVENTION

Hereinafter, the present invention will be more specifically described by reference to the drawings, but the present invention is by no means limited by the description.

FIG. 1 shows an example of a method for producing an SOI wafer by a bonding method of the present invention. The outline of a method for producing an SOI wafer by a bonding method to which the present invention is applied is shown in the following.

First, in Step (a), a silicon single crystal wafer (bond wafer) 11 to serve as an SOI layer for forming a semiconductor device and a silicon single crystal wafer (base wafer) 14 to serve as a support substrate are prepared.

Next, in Step (b), an insulator film 13 to serve as a buried insulator layer is formed on at least one of the base wafer 14 and the bond wafer 11 (Shown here is the insulator film 13 formed on the base wafer 14).

Then, in Step (c), ion-implanting of a neutral element is performed from a surface of at least one of the base wafer 14 and the bond wafer 11 to form an ion-implanted damaged layer 12 (Shown here is the bond wafer 11 having the ion-implanted damaged layer formed). Prior to ion-implanting, a screen oxide film may be formed on a surface of the bond wafer 11. The removal of the screen oxide film before Step (d)

is optional. In the present invention, the dosage of the ion-implanted neutral element is specified, which will be described hereinafter.

Then, in Step (d), the base wafer 14 and the bond wafer 11 are, with the surface having the ion-implanted damaged layer 12 formed as a bonding surface, brought into close contact and bonded together via the insulator film 13. In this way, a bonded wafer 20 having a bonding surface 15 is obtained.

Then, in Step (e), a bonding heat treatment for increasing the bonding strength of the bonding surface 15 is performed. For example, by performing a heat treatment in acidic or inert gas atmosphere, at 1000° C. to 1200° C., for 10 minutes to 6 hours, the two wafers are strongly bonded.

Then, in Step (f), the bond wafer 11 is thinned to a desired thickness to obtain an SOI wafer 50 having an ion-implanted damaged layer 52 and having an SOI layer 51 formed above a support substrate 54 via a Box layer 53 in between.

It should be noted that, as to thinning of the bond wafer, there may be used, for example, a method based on surface grinding or mirror polishing, which is appropriate for forming a relatively thick SOI layer. There may also be used a method called an ion implantation delamination method where an ion layer for delamination is formed by implanting hydrogen ions or helium ions into a surface to be bonded of the bond wafer in advance before Step (d) of bonding the bond wafer to the base wafer and thinning is performed by forming delaminating the bond wafer at an ion-implanted layer for delamination after bonding, which is appropriate for forming a thin SOI layer. Incidentally, in the case of performing thinning by the ion implantation delamination method, the steps are in the following order: bonding at room temperature; performing a heat treatment at approximately as low as 500° C. if necessary to perform delamination; and performing Step (e) of bonding heat treatment for increasing bonding strength. In addition, on this occasion, there may be used a method where delamination is performed by mechanical stress at the ion-implanted layer without performing the heat treatment at approximately 500° C. by bonding after the activation of a surface of the wafer to be bonded with a plasma treatment.

Incidentally, the ion-implanted layer for delamination may be formed before or after an ion-implanting step for forming a gettering layer.

In this way, the SOI wafer 50 having the ion-implanted damaged layer 52 is obtained. In the case of ion-implanting into the bond wafer 11 when ion-implantation is conducted in Step (c) in FIG. 1 described above, the ion-implanted damaged layer 52 is formed in an interface area of the SOI layer 51 with the Box layer 53 as shown in FIG. 2 (a). On the contrary, in the case of ion-implanting into the base wafer 14, the ion-implanted damaged layer 52 is formed in an interface area of the support substrate 54 with the Box layer 53 as shown in FIG. 2 (b).

There have been problems of the abnormal occurrence of leak current or degradation of oxide dielectric breakdown voltage as described above in a method for producing an SOI wafer where an ion-implanted damaged layer is introduced by ion-implanting into a silicon single crystal wafer and used as a gettering layer through these steps.

The present inventors focused on secondary defects from the ion-implanted damaged layer after the bonding heat treatment as a specific factor responsible for such degradation of the SOI wafer characteristics.

In other words, conventionally, it has been considered that a dosage of $1 \times 10^{15}$ atoms/cm$^2$ or more is required in order to introduce an ion-implanted damaged layer formed for gettering in an SOI wafer. It is true that, at such a dosage, strong gettering ability is added to the SOI wafer, but such a dosage leads to generating a large amount of secondary defects during the bonding heat treatment, thereby degrading the characteristics of the SOI wafer in some cases. Furthermore, when the order of the dosage is increased by one, time required for ion-implanting is approximately tenfold. At a conventional dosage of $1 \times 10^{15}$ atoms/cm$^2$ or more, long-time ion-implanting is required, thereby lowering the productivity and pushing the cost higher.

Based on these facts, the present inventors continued intensive investigation further to find out that, in producing an SOI wafer by a bonding method, in the case of ion-implanting a neutral element electrically inactive in silicon (hereinafter simply referred to as a neutral element) during ion-implantation of the neutral element in order to form an ion-implanted damaged layer for gettering, even at a dosage lower than the conventional one, sufficient gettering of metal impurities is achieved. Finally, the present inventors completed the present invention by optimizing various conditions.

Specifically, it was revealed that, in a method for producing an SOI wafer as shown in FIG. 1, in the step of ion-implanting shown in FIG. 1 (c), when the dosage of the neutral element to be ion-implanted is $1 \times 10^{12}$ atoms/cm$^2$ or more and less than $1 \times 10^{15}$ atoms/cm$^2$, which is smaller than the conventional one, sufficient gettering ability is obtained and that the occurrence of secondary defects from the ion-implanted damaged layer during the bonding heat treatment is suppressed. Furthermore, since sufficient gettering ability is obtained at such a low dosage as in the present invention, conventional long-time ion-implanting is no longer required, thereby contributing to the higher productivity and the lower cost.

Furthermore, in order to suppress the occurrence of secondary defects from the ion-implanted damaged layer during the bonding heat treatment more strongly, the dosage of the neutral element is far preferably $1 \times 10^{14}$ atoms/cm$^2$ or less, and greatly preferably $1 \times 10^3$ atoms/cm$^2$ or less.

It should be noted that $1 \times 10^{12}$ atoms/cm$^2$, which is the lower limit of the dosage effective for the present invention, is approximately the value of the lower limit of the dosage that allows ion-implanting stably controllable by a general ion-implanter.

On this occasion, in order to add gettering ability to the SOI wafer more certainly, the dosage of the neutral element is preferably $5 \times 10^{12}$ atoms/cm$^2$ or more.

The present inventors have also found out that the upper limit of the dosage necessary to suppress the occurrence of secondary defects differs according to the kind of element implanted. As the neutral element to be ion-implanted, ion species of argon, carbon, oxygen, and silicon are preferable.

Particularly, in the case of introducing an ion-implanted damaged layer by ion-implanting argon into silicon, there may be obtained a gettering site having strong gettering ability, which is preferable.

On this occasion, in order to suppress the occurrence of secondary defects during the bonding heat treatment more certainly, the dosage is preferably $1 \times 10^{13}$ atoms/cm$^2$ or less in the case of ion-implanting carbon, less than $1 \times 10^{15}$ atoms/cm$^2$ in the case of ion-implanting oxygen, and $1 \times 10^{14}$ atoms/cm$^2$ or less in the case of ion-implanting argon or silicon.

In addition, the acceleration voltage of the ion-implanter is preferably 200 keV or less because there can be suppressed the occurrence of secondary defects from the ion-implanted damaged layer during the bonding heat treatment more certainly. Furthermore, even at such an acceleration voltage, a sufficient gettering effect is added to the SOI wafer.

It should be noted that no clear limitations are made as to the lower limit of the acceleration voltage during the ion-implantation of the neutral element. However, since it is necessary to ion-implant the neutral element into the silicon single crystal wafer, the lower limit of the acceleration voltage, as is dependent on the implanted element, may be placed at 10 keV, for example.

Furthermore, the thickness of the ion-implanted layer is preferably kept at 0.5 μm or less by adjusting the acceleration voltage of the ion-implanter of the present invention. As is dependent on the implanted element, it is generally achievable to realize such a thickness of the ion-implanted layer by placing the acceleration voltage of the ion-implanter at approximately 200 keV or less.

At such a thickness of the ion-implanted layer, although the ion-implanted layer is hardly recognizable by ordinary cross-sectional TEM observation, sufficient gettering ability is added when an SOI wafer is produced. What is more, at such a thickness of the ion-implanted damaged layer, there can be suppressed the occurrence of secondary defects from the ion-implanted damaged layer during the bonding heat treatment more certainly.

It should be noted that no clear limitations are made as to the lower limit of the acceleration voltage upon ion-implanting the neutral element but that the acceleration voltage is determined by the lower limit of the acceleration voltage of the ion-implanter.

Incidentally, in the present invention, the ion-implanted damaged layer is formed around the bonding surface of the bond wafer and the base wafer. In other words, as described above, as shown in FIG. 2, the ion-implanted damaged layer is formed in an interface area of the SOI layer with the Box layer in the case of ion-implanting into the surface of the bond wafer and in an interface area of the support substrate with the Box layer in the case of ion-implanting into the surface of the base wafer. In any case, since there is no difference between the bonding states of the bonding surface for both, the ion-implanted damaged layers for both basically have nearly equal gettering ability.

However, due to the difference between the diffusion rates of metal impurities in silicon and those in silicon oxide, metal impurities have difficulty in passing the Box layer. Therefore it may be said that a gettering layer is preferably formed in an interface area of the SOI layer with the Box layer for the gettering of the metal contaminants on the surface of the SOI layer providing an area for fabricating a device. In other words, bonding is far preferably performed after forming the ion-implanted damaged layer by ion-implanting the neutral element into the surface of the bond wafer.

However, even when the ion-implanted damaged layer is formed on a surface of the bond wafer to form a gettering layer in an interface area of the support substrate with the Box layer, a more effective gettering site is obtained than in a conventional method in which a gettering layer is introduced into a back surface of the SOI wafer. In addition, an SOI wafer having a thinner Box layer is developed every year. When the thickness of the Box layer is 100 nm or less, for example, even an ion-implanted damaged layer formed in an interface area of the support substrate with the Box layer is also more effective for the gettering of metal contaminants in the SOI layer.

Furthermore, a method for producing an SOI wafer of the present invention is applicable without any problem when the insulator layer to serve as the Box layer is a silicon oxide film, a silicon nitride film, or the like. A silicon oxide film is preferable because a compact and high-quality product is easily produced by thermal oxidation of the bond wafer or the base wafer. However, the method is not limited to this and a silicon oxide film may be deposited by a CVD method. Furthermore, when forming a silicon nitride film, a silicon oxynitride film, or another insulator film, general methods for each may be used for forming. In addition, a silicon nitride film may be combined with a silicon oxide film.

Furthermore, in a method for producing an SOI wafer of the present invention, an $n^+$ layer may further be introduced in the neighborhood of the layer where the ion-implanted damaged layer of the present invention is formed. The $n^+$ layer, sometimes required in terms of a device structure, also possesses gettering ability, thereby providing a stronger gettering site in combination with the gettering ability of the damaged layer ion-implanted with the neutral element.

Specifically, the $n^+$ layer is introduced by adopting a step of forming an $n^+$ layer through ion-implanting an element serving as a donor in silicon, namely phosphorus, arsenic, and antimony from the same surface from which the neutral element is ion-implanted at least before the step of bonding.

Moreover, even when the $n^+$ layer is introduced in addition to an ion-implanted damaged layer, the ion-implanted damaged layer formed by ion-implanting the neutral element at the dosage according to the present invention suppresses the occurrence of secondary defects from the ion-implanted damaged layer during the bonding heat treatment. Therefore there can be suppressed the abnormal occurrence of leak current or degradation of oxide dielectric breakdown voltage.

EXAMPLES

Hereinafter, the present invention is described more specifically showing the examples of the present invention, but these examples should by no means be construed as limiting the present invention.

Example 1

Following the steps as shown in FIG. 1, an SOI wafer having an ion-implanted damaged layer was produced as described below.

First, two mirror-polished N-type silicon single crystal wafers, 200 mm in diameter, a plane orientation of {100}, were prepared (a). Upon a surface of a base wafer 14, a silicon oxide film 13 approximately 1 μm in film thickness, which is to serve as a Box layer, was formed by thermal oxidation (b).

Subsequently, onto a surface of the bond wafer 11, argon is ion-implanted under the conditions of an acceleration voltage of 100 keV and a dosage of $1\times10^{14}$ atoms/cm$^2$ (c).

Then, the bond wafer 11 and the base wafer 14 were, with the surface of the bond wafer 11 ion-implanted with argon as a bonding surface, brought into contact and bonded together in such a way that the insulator film 13 was placed in between (d). Subsequently, a bonding heat treatment for increasing the bonding strength was performed under the following conditions (e). Namely, the bonded wafer was placed into a heat treatment furnace set at 800° C. and a temperature was increased at a temperature-increase rate of 10° C./min to the maximum temperature 1150° C., kept for 2 hours, and dropped to 800° C. Then the wafer was taken out of the heat treatment furnace.

After that, the bond wafer 11 of the bonded wafer 20 was, by surface grinding and mirror polishing, thinned to a thickness of approximately 12 μm to obtain an SOI wafer 50 (f).

After the SOI wafer thus produced was cut in thickness direction and the cut surface was polished, cross-sectional TEM was observed.

Incidentally, the gettering ability of the SOI wafer thus produced was evaluated as follows. First, Ni was coated on a surface of the SOI layer at a density of $1\times10^{13}$ atoms/cm$^2$ and was caused to diffuse internally by a heat treatment at 1000°

C. for 1 hour. Next, by etching stepwise the surface oxide film, the SOI layer, the Box layer, and the support substrate surface layer (to approximately 2 μm from the surface at the side of the Box layer), Ni concentration of the solution was measured using ICP-MS (Inductively Coupled Plasma Mass Spectrometry) to determine the distribution of the Ni density in the depth direction. For each of the surface oxide film and the Box layer with a HF solution in one step, for the SOI layer with a mixed acid solution at intervals of approximately 2 μm in six separate steps, for the support substrate surface layer with a mixed acid solution in one step, Ni density was measured.

Examples 2, 3, and 4

An SOI wafer was produced in a method similar to the one used in Example 1 except that the neutral element ion-implanted was carbon (Example 2), oxygen (Example 3), or silicon (Example 4) and that the SOI layer was thinned to a thickness of approximately 14 μm. Then using the technique similar to the one in Example 1, cross-sectional TEM of the SOI wafers was observed and the gettering ability was evaluated. However, as for the SOI layer, the Ni density was measured in seven separate steps.

Comparative Examples 1, 2, 3, and 4

An SOI wafer was produced in a method similar to the one used in Example 1 except that argon (Comparative Example 1), carbon (Comparative Example 2), oxygen (Comparative Example 3), or silicon (Comparative Example 4) was ion-implanted at a dosage of $1\times10^{15}$ atoms/cm$^2$ and that the SOI layer was thinned to a thickness of approximately 14 μm. Then using the technique similar to the one in Example 1, cross-sectional TEM of the SOI wafers was observed and the gettering ability was evaluated. However, as for the SOI layer, the Ni density was measured in seven separate steps.

Cross-sectional TEM images of the SOI wafers of Examples 1 to 4 and Comparative Examples 1 to 4 are shown in FIG. 3. Note that a dotted line indicates the interface of the SOI layer including the Box layer and the ion-implanted damaged layer and that a broken line is the 0.2 μm mark from the interface of the Box layer and the SOI layer. In addition, the results of gettering ability evaluation with SOI wafers in Examples 1 to 4 and Comparative Example 1 to 4 are shown in FIG. 4. Note that, under the horizontal axis, "SiO2" stands for the surface oxide film, "SOI-1-6(7)" for the SOI layer measured in the order of distance from the surface, "BOX" for the Box layer, "BAS" for the support substrate, "SUM" for the sum total. In addition, the numbers of defects existing in 1 μm×1 μm, which was measured by cross-sectional TEM observation of Examples 1 to 4 and Comparative Example 1 to 4, are shown in Table 1.

TABLE 1

| Dosage (atoms/cm$^2$) | Ar | C | O | Si |
|---|---|---|---|---|
| $1\times10^{12}$ | 0 | 0 | 0 | 0 |
| $1\times10^{13}$ | 0 | 0 | 0 | 0 |
| $1\times10^{14}$ | 0 | >10 | 0 | 0 |
| $1\times10^{15}$ | >100 | >100 | 0 | >10 |
| $1\times10^{16}$ | X | X | X | X |

Almost no defects observable with a TEM image were formed with any of the neutral elements at a dosage of $1\times10^{14}$ atoms/cm$^2$. In addition, when the gettering layer was the layer distant from the Box layer by 0 to 2 μm within the SOI layer (SOI-6 for argon and SOI-7 for the other elements), Ni was trapped in the gettering layer and the gettering layer possessed sufficient gettering ability. On the other hand, the gettering ability was a little stronger at a dosage of $1\times10^{15}$ atoms/cm$^2$ than at a dosage of $1\times10^{14}$ atoms/cm$^2$, but defects started to be formed in the interface, which is considered to have a harmful effect on the characteristics of the SOI layer. Note that, in Table 1, ">10" indicates approximately tens of defects and ">100", approximately hundreds of defects. In addition, at a dosage of $1\times10^{15}$ atoms/cm$^2$ or more, long-time ion-implanting was required, thereby lowering the productivity and pushing the cost higher.

Comparative Example 5

An SOI wafer was produced in a method similar to the one used in Example 1 except that no formation of an ion-implanted damaged layer into the bond wafer 11 by ion-implanting was performed. After that, the evaluation of the gettering ability was carried out. As a result, as shown in FIG. 5, Ni was distributed on the surface side of the SOI layer at a high density and the gettering ability was extremely low.

Examples 5 and 6, and Comparative Example 6

Furthermore, an SOI wafer was produced in a method similar to the one used in Example 1 except that one element out of argon, carbon, oxygen, and silicon each was ion-implanted at a dosage of $1\times10^{12}$ atoms/cm$^2$ (Example 5), $1\times10^{13}$ atoms/cm$^2$ (Example 6), and $1\times10^{16}$ atoms/cm$^2$ (Comparative Example 6). Then, by a method similar to the one used in Example 1, observations of the cross-sectional TEM of the SOI wafers were made and the results were also shown in Table 1.

With any of the neutral element, no defects were observed at a dosage of $1\times10^{12}$ atoms/cm$^2$ or $1\times10^{13}$ atoms/cm$^2$.

On the other hand, at a dosage of $1\times10^{16}$ atoms/cm$^2$, there were too many defects with any of the neutral element to measure (Immeasurability is indicated by "x" in Table 1).

Examples 7 to 16, and Comparative Example 7

Two mirror-polished N-type silicon single crystal wafers, 200 mm in diameter, a plane orientation of {100}, were prepared. Upon the surface of the base wafer, a silicon oxide film approximately 1.3 μm in film thickness, which was to serve as a Box layer, was formed by thermal oxidation.

Subsequently, onto the surface of the bond wafer, argon was ion-implanted under the conditions shown in Table 2.

TABLE 2

| | Dosage (atoms/cm$^2$) | Acceleration Energy (keV) |
|---|---|---|
| Example 7 | $5\times10^{12}$ | 100 |
| Example 8 | $1\times10^{13}$ | 100 |
| Example 9 | $3\times10^{13}$ | 100 |
| Example 10 | $1\times10^{14}$ | 100 |
| Example 11 | $3\times10^{14}$ | 100 |
| Example 12 | $1\times10^{14}$ | 40 |
| Example 13 | $1\times10^{14}$ | 60 |
| Example 14 | $1\times10^{14}$ | 80 |
| Example 15 | $1\times10^{14}$ | 100 |
| Example 16 | $1\times10^{12}$ | 100 |
| Comparative Example 7 | $1\times10^{15}$ | 100 |

Then, after performing bonding and a bonding heat treatment in a method similar to the one in Example 1, by surface grinding and mirror polishing, the side of the bond wafer was thinned to a thickness of approximately 14 µm to obtain an SOI wafer.

The gettering abilities of the SOI wafers thus produced were evaluated in a method similar to that in Example 1. First, Ni was coated on the SOI surface at a density of approximately $5\times10^{12}$ atoms/cm$^2$ and was caused to diffuse internally by a heat treatment at 1000° C. for 1 hour. Next, by etching stepwise the surface oxide film, the SOI layer, the Box layer, and the support substrate surface layer, Ni concentration of the solution was measured using ICP-MS to determine the distribution of the Ni density in the depth direction. For each of the surface oxide film and the Box layer with a HF solution in one step, for the SOI layer with a mixed acid solution at intervals of approximately 2 µm in seven separate steps, for the support substrate surface layer with a mixed acid solution in one step, Ni density was measured. In addition, by observing cross-sectional TEM, observations were made of defects in the neighborhood of the interface between the SOI layer and the Box layer.

The gettering abilities of Examples 7 to 11 and 16 and Comparative Example 7 are shown in FIG. 6. The values on the vertical axis indicate the Ni density of a layer distant from the Box layer of the SOI layer by 0 to 2 µm (gettering layer). At a dosage of $5\times10^{12}$ atoms/cm$^2$ or more (Examples 7 to 11, and comparative Example 7), gettering was accomplished of almost all the Ni coated on the surface. However, in Comparative Example 7, by observing cross-sectional TEM, a lot of defects were observed in the gettering layer as in FIG. 3. It is true that defects were observed in Comparative Example 11, but the defects were not as dense as in Comparative Example 7, which means that the occurrence of secondary defects was obviously suppressed. At a dosage of $1\times10^{12}$ atoms/cm$^2$ (Example 16), almost no defects were formed and the Ni density in the gettering layer showed a stable value at the level of $10^{11}$ atoms/cm$^2$. However, the gettering ability was low as compared with that of any of Comparative Examples 7 to 11. Therefore it is indicated that, in order to produce an SOI wafer having sufficient gettering ability more certainly, the dosage is desirably $5\times10^{12}$ atoms/cm$^2$ or more.

The gettering abilities of Examples 12 to 15 are shown in FIG. 7. At any acceleration voltage, the wafers had sufficient gettering abilities.

Examples 17 to 20

Two mirror-polished P-type silicon single crystal wafers, 200 mm in diameter, a plane orientation of {100}, were prepared. Onto a surface of the bond wafer, a silicon oxide film approximately 75 nm in film thickness was formed by thermal oxidation and onto the surface of the base wafer, a silicon oxide film approximately 225 nm in film thickness.

Then, onto the surface of the bond wafer, hydrogen for ion-implantation delamination was ion-implanted. Subsequently, argon was ion-implanted under the conditions of acceleration voltage 40 keV (Example 17), 60 keV (Example 18), 80 keV (Example 19), and 100 keV (Example 20). The dosage applied on this occasion was $1\times10^{14}$ atoms/cm$^2$.

Subsequently, in a procedure similar to the one in a general ion implantation delamination method, after the steps such as bonding, a delamination heat treatment, a bonding heat treatment, SOI layer modulation oxidation, and oxide film removal, an SOI wafer approximately 0.3 µm in thickness was obtained.

Furthermore, upon the surface of the SOI layer, a silicon layer 2.7 µm in film thickness was deposited by epitaxial growth to make the film thickness of the SOI layer approximately 3 µm.

The gettering abilities of the SOI wafers thus produced were evaluated in a method similar to that in Example 1. First, Ni was coated on the SOI surface at a density of approximately $5\times10^{12}$ atoms/cm$^2$ and was caused to diffuse internally by a heat treatment at 1000° C. for 1 hour. Next, by etching stepwise the surface oxide film, the SOI layer, the Box layer, and the support substrate surface layer, Ni concentration of the solution was measured using ICP-MS to determine the distribution of the Ni density in the depth direction. For each of the surface oxide film and the Box layer with a HF solution in one step, for the SOI layer with a mixed acid solution at intervals of approximately 0.6 µm in five separate steps, for the support substrate surface layer with a mixed acid solution in one step, Ni density was measured.

The gettering abilities of wafers in Examples 17 to 20 are shown in FIG. 8. The values on the vertical axis indicate the Ni density of a layer distant from the Box layer of the SOI layer by 0 to 0.6 µm (gettering layer). Similarly to those of Examples 12 to 15, at any acceleration voltage, the wafers had sufficient gettering abilities.

It is to be noted that the present invention is not restricted to the foregoing embodiment. The foregoing embodiment is just an example, and any example which has a structure substantially equal to a technical concept described in claims of the present invention and demonstrates the same functions and effects is included in a technical scope of the present invention.

The invention claimed is:

1. A method for producing an SOI wafer, comprising at least the steps of:
   preparing a base wafer and a bond wafer each made of silicon single crystal;
   forming an insulator film on a surface of at least one of the base wafer and the bond wafer;
   forming an ion-implanted damaged layer by ion-implanting a neutral element electrically inactive in silicon from a surface of the base wafer or the bond wafer;
   bonding, at the ion-implanted surface, the base wafer and the bond wafer via the insulator film; and
   thinning the bond wafer bonded, wherein
   the neutral element for ion-implanting is argon;
   ion-implanting of the neutral element in the step of forming the ion-implanted damaged layer is performed at a dosage of $1\times10^{12}$ atoms/cm$^2$ or more and $1\times10^{13}$ atoms/cm$^2$ or less; and
   an acceleration voltage upon ion-implanting the neutral element is 200 keV or less.

2. The method for producing an SOI wafer according to claim 1, wherein
   the thickness of the ion-implanted damaged layer is 0.5 µm or less.

3. The method for producing an SOI wafer according to claim 1, wherein
   the insulator film is a silicon oxide film, a silicon nitride film, or a combination of these.

4. The method for producing an SOI wafer according to claim 1, wherein
   thinning of the bond wafer is performed by grinding the bond wafer.

5. The method for producing an SOI wafer according to claim 1, wherein
   thinning of the bond wafer is performed by preparing an ion-implanted layer for delaminating before the step of bonding in advance through ion-implanting hydrogen or helium from the surface of the bond wafer, followed by delaminating the bond wafer at the ion-implanted layer for deaminating through a delamination heat treatment in the step of thinning the bond wafer.

6. The method for producing an SOI wafer according to claim 1, comprising
a step of forming an n+ layer by ion-implanting an element serving as a donor in silicon from the surface ion-implanted with the neutral element at least before the step of bonding.

7. The method for producing an SOI wafer according to claim 6, wherein
the element serving as a donor is at least any one of phosphorus, arsenic, and antimony.

8. The method for producing an SOI wafer according to claim 1, wherein
the dosage of the neutral element is $5\times10^{12}$ atoms/cm$^2$ or more.

* * * * *